United States Patent
Cho

(10) Patent No.: US 8,675,421 B2
(45) Date of Patent: Mar. 18, 2014

(54) SEMICONDUCTOR MEMORY DEVICE

(75) Inventor: Yong Deok Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 228 days.

(21) Appl. No.: 13/244,125

(22) Filed: Sep. 23, 2011

(65) Prior Publication Data

US 2012/0099390 A1 Apr. 26, 2012

(30) Foreign Application Priority Data

Oct. 26, 2010 (KR) .................. 10-2010-0104856

(51) Int. Cl.
*G11C 7/00* (2006.01)
(52) U.S. Cl.
USPC ............... 365/189.05; 365/189.03; 365/203; 365/206
(58) Field of Classification Search
USPC ............ 365/189.05, 203, 189.03, 206, 207
See application file for complete search history.

(56) References Cited

U.S. PATENT DOCUMENTS 6,967,868 B2 * 11/2005 Kim et al. ............... 365/185.09
7,808,825 B2 * 10/2010 Park ........................ 365/185.12

FOREIGN PATENT DOCUMENTS

| KR | 100408421 | 12/2003 |
| KR | 1020040078785 | 9/2004 |
| KR | 100454144 | 10/2004 |

OTHER PUBLICATIONS

Office Action issued by the Korean Intellectual Property Office on Dec. 26, 2011.

* cited by examiner

*Primary Examiner* — Son Dinh
(74) *Attorney, Agent, or Firm* — IP & T Group LLP

(57) ABSTRACT

A semiconductor memory device includes a first page buffer group including a plurality of page buffers coupled to memory cells of a first memory array through bit lines, a second page buffer group, a coupling circuit configured to couple an output terminal and an inverse output terminal of a selected page buffer of the first page buffer group to a first local I/O line and a first inverse local I/O line, respectively, or an output terminal and an inverse output terminal of a selected page buffer of the second page buffer group to a second local I/O line and a second inverse local I/O line, respectively, in response to a column select signal, and a sense amplifier configured to detect a voltage difference between the first local I/O line and the first inverse local I/O line or between the second local I/O line and the second inverse local I/O line.

20 Claims, 6 Drawing Sheets

SEMICONDUCTOR MEMORY DEVICE

CROSS-REFERENCE TO RELATED APPLICATION

Priority to Korean patent application number 10-2010-0104856 filed on Oct. 26, 2010, the entire disclosure of which is incorporated by reference herein, is claimed.

BACKGROUND

Exemplary embodiments relate to a semiconductor memory device and, more particularly, to a semiconductor memory device with an improved operating speed.

Page buffers for reading data stored in memory cells are used in a flash memory device. The page buffer includes a latch circuit for detecting threshold voltages of the memory cells and latches data corresponding to a detected voltage. The latch circuit includes an output terminal and an inverse output terminal. The output terminal and the inverse output terminal of the latch circuit operate as the output terminal and the inverse output terminal of the page buffer.

Data is outputted to global I/O lines according to a voltage difference between the output terminal and the inverse output terminal of the page buffer. In order to improve the operating speed, it is useful to reduce the time for outputting data from the output terminal and the inverse output terminal of the page buffer to the global word line.

BRIEF SUMMARY

According to exemplary embodiments, the operating speed can be improved by reducing the time for outputting data from the output terminal and the inverse output terminal of a page buffer to a global word line.

A semiconductor memory device according to an aspect of the present disclosure includes a first page buffer group including page buffers coupled to the memory cells of a first memory array through bit lines; a second page buffer group including page buffers coupled to the memory cells of a second memory array through bit lines; a coupling circuit configured to couple an output terminal and an inverse output terminal of a selected page buffer of the first page buffer group to a first local I/O line and a first inverse local I/O line, respectively, or an output terminal and an inverse output terminal of a selected page buffer of the second page buffer group to a second local I/O line and a second inverse local I/O line, respectively, in response to a column select signal; and a sense amplifier configured to detect a voltage difference between the first local I/O line and the first inverse local I/O line or a voltage difference between the second local I/O line and the second inverse local I/O line in response to line select signals and to output data of the selected page buffer of the first page buffer group or the selected page buffer of the second page buffer group to a global I/O line.

A semiconductor memory device according to another aspect of the present disclosure includes a first page buffer group including page buffers coupled to the memory cells of a first memory array through bit lines; a second page buffer group including page buffers coupled to the memory cells of a second memory array through bit lines; a coupling circuit configured to couple an output terminal and an inverse output terminal of a selected page buffer of the first page buffer group to a first local I/O line and a first inverse local I/O line, respectively, or an output terminal and an inverse output terminal of a selected page buffer from the second page buffer group, to a second local I/O line and a second inverse local I/O line, respectively, in response to a column select signal; a first sense amplifier configured to detect a voltage difference between the first local I/O line and the first inverse local I/O line in response to a first strobe signal; a second sense amplifier configured to detect a voltage difference between the second local I/O line and the second inverse local I/O line in response to a second strobe signal; and a multiplexer configured to output the output signal of the first sense amplifier or the second sense amplifier to a global I/O line in response to an output select signal.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
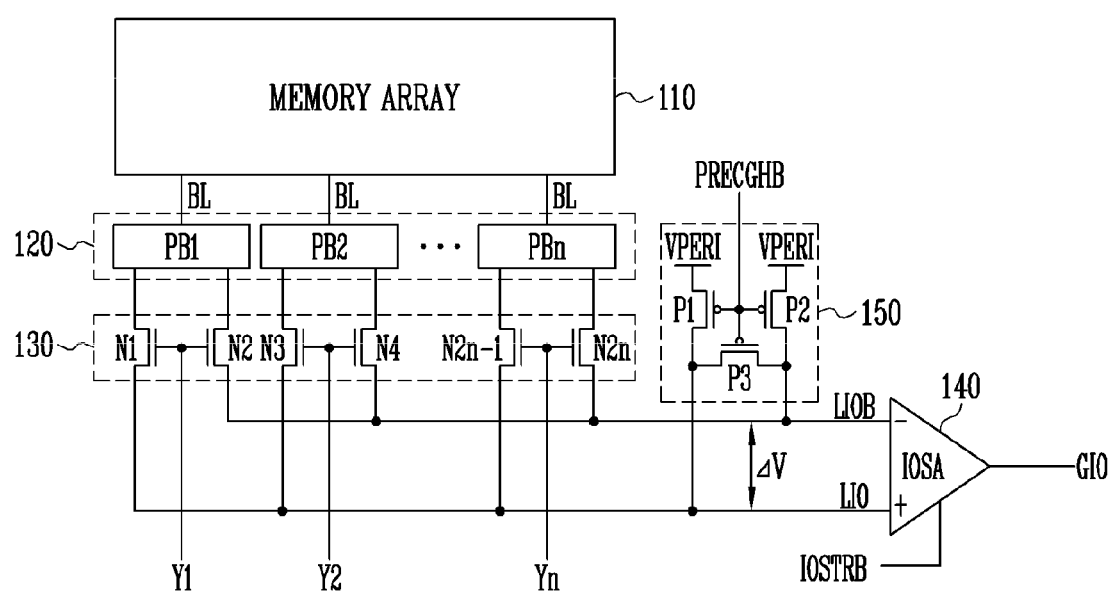
FIG. 1 is a circuit diagram of a semiconductor memory device according to an exemplary embodiment of this disclosure.

FIG. 1 is a circuit diagram of a semiconductor memory device according to an exemplary embodiment of this disclosure.

Referring to FIG. 1, the semiconductor memory device includes a memory array 110, a page buffer group 120, a coupling circuit 130, a sense amplifier 140, and a precharge circuit 150.

In the case of a NAND flash memory device, the memory array 110 includes a number of memory cell blocks. The structure for memory array 110 of a NAND flash memory device is well known in the art, and thus, a detailed description thereof is omitted.

The page buffer group 120 includes a number of page buffers PB1 to PBn. Each of the page buffers is electrically coupled to the memory cells of the memory array through a bit line BL. The page buffer operates to temporarily store received data in order to store the data in the memory cells and to control a voltage of the respective bit line BL according to data stored therein in a program operation for storing data in the memory cells. Furthermore, the page buffer precharges the bit line BL in a read operation for reading data stored in the memory cells, detects a shift in the voltage of the bit line BL which varies according to threshold voltages of the memory cells, and temporarily stores the data stored in the memory cells in order to externally output the stored data according to a detected voltage.

The page buffer includes a latch circuit (not shown) for temporarily storing data. The latch circuit includes an output terminal and an inverse output terminal. The output terminal and the inverse output terminal of the latch circuit operate as the output terminal and the inverse output terminal of the page buffer.

As shown in FIG. 1, a page buffer may be coupled to a respective bit line BL. According to another example, the page buffer may be coupled to a pair of an even bit line and an odd bit line.

The coupling circuit 130 couples the output terminal and the inverse output terminal of page buffers to a local I/O line LIO and an inverse local I/O line LIOB in response to each of column select signals Y1 to Yn. More particularly, the coupling circuit 130 sequentially couples the output terminals and the inverse output terminals of an enabled one of the page buffers PB1 to PBn to the local I/O line LIO and the inverse local I/O line LIOB in response to the respective column select signals Y1 to Yn.

To this end, the coupling circuit 130 includes odd switching elements N1 and N3 to N2n-1 coupled between the local I/O line LIO and the respective output terminals of the page buffers PB1 to PBn and even switching elements N2 and N4 to N2n coupled between the inverse local I/O line LIOB and the respective inverse output terminals of the page buffers PB1 to PBn. Accordingly, a pair of the switching elements N1 and N2 is coupled to the page buffer PB1 and operated in response to the column select signal Y1.

The local I/O line LIO is coupled to the first input terminal of the sense amplifier 140, and the inverse local I/O line LIOB is coupled to the second input terminal (or an inverse input terminal) of the sense amplifier 140. When signals (or data) outputted from the output terminal and the inverse output terminal of the page buffer PB1 are supplied to the local I/O line LIO and the inverse local I/O line LIOB via the switching elements N1 and N2 in response to the column select signal Y1, the sense amplifier 140 detects and amplifies a voltage difference between the local I/O line LIO and the inverse local I/O line LIOB in response to a strobe signal IOSTRB and outputs detected data to a global I/O line GIO.

To this end, the output terminal and the inverse output terminal of the page buffer PB1 are coupled to the local and inverse local I/O lines (hereinafter referred to as 'local lines') LIO and LIOB through the respective switching elements N1 and N2. When data is outputted from the page buffer PB1 to the local lines LIO and LIOB, the sense amplifier 140 detects and amplifies a voltage difference between the local lines LIO and LIOB.

The precharge circuit 150 precharges the local lines LIO and LIOB. More particularly, the precharge circuit 150 precharges the local lines LIO and LIOB before the output terminal and the inverse output terminal of the page buffer PB1 are coupled to the local lines LIO and LIOB through the switching elements N1 and N2. When the local lines LIO and LIOB are precharged by the precharge circuit 150 and thus the output terminal and the inverse output terminal of the page buffer PB1 are coupled to the respective local lines LIO and LIOB, a voltage of one of the local lines LIO and LIOB is lowered due to data outputted from the page buffer PB1. The precharge circuit 150 includes switching elements P1 and P2 coupled between the respective local lines LIO and LIOB and respective terminals for supplying a precharge voltage VPREI and a switching element P3 coupled between the local lines LIO and LIOB. According to another example, different precharge voltages may be supplied to different one of the switching elements P1 and P2. The switching elements P1, P2, and P3 are operated in response to a precharge signal PRECGHB.

The operation of the semiconductor memory device is described in detail below.

Figure 2:
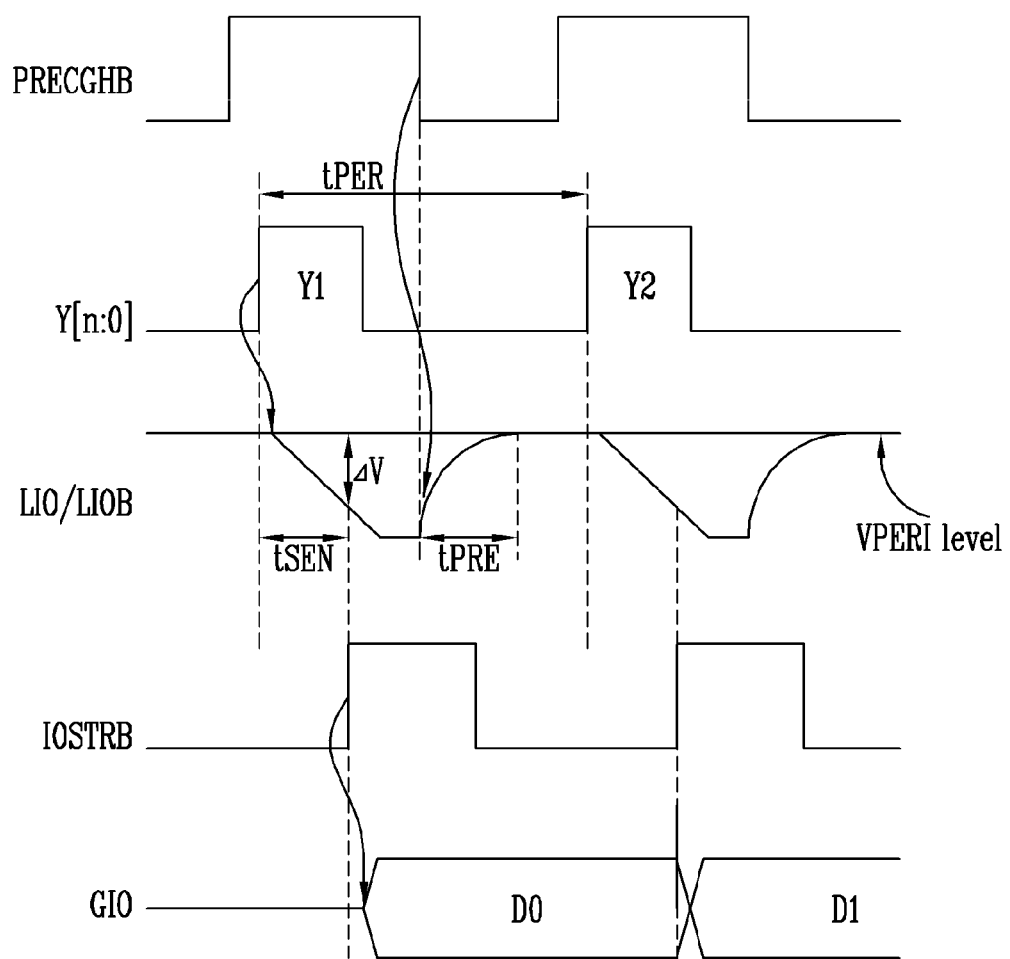
FIG. 2 is a waveform illustrating the operation of the semiconductor memory device shown in FIG. 1.

FIG. 2 is a waveform illustrating the operation of the semiconductor memory device shown in FIG. 1.

Referring to FIGS. 1 and 2, a precharge operation is performed. More specifically, when the precharge signal PRECGHB of a low level is received, the local lines LIO and LIOB are precharged with the precharge voltage VPERI supplied by the precharge circuit 150. Next, when the precharge signal PRECGHB shifts to a high level, the precharge circuit 150 is disabled and the supply of the precharge voltage VPERI is stopped. At this time, the local lines LIO and LIOB enter a floating state. Even though the supply the precharge voltages VPERI is stopped, the local lines LIO and LIOB remain precharged.

An operation of selecting a page buffer is performed. When the column select signal Y1 is activated, the output terminal and the inverse output terminal of the page buffer PB1 is coupled to the local lines LIO and LIOB through the coupling circuit 130. Data (or signal) and inverse data (or inverse signal) of the page buffer PB1 are outputted to the local lines LIO and LIOB. A voltage level of one of the precharged local lines LIO and LIOB is lowered by the data or the inverse data of the page buffer PB1.

Next, a data output operation is performed. More specifically, when the strobe signal IOSTRB is activated, the sense amplifier 140 detects and amplifies a voltage difference between the local lines LIO and LIOB and outputs data D0, corresponding to a result of the amplification, to the global I/O line GIO. Meanwhile, the sense amplifier 140 outputs the data D0 based on the voltage difference between the local lines LIO and LIOB when the strobe signal IOSTRB is at a rising edge.

After the data D0 is outputted to the global I/O line GIO, data D1 stored in the next page buffer PB2 is outputted to the global I/O line GIO by means of the precharge operation, the page buffer selection operation according to the next column select signal Y2, and the data output operation.

A point of time at which the sense amplifier 140 detects a voltage difference between the local lines LIO and LIOB is varied and the voltage difference detected by the amplifier 140 is determined, according to the time tSEN between the activation of the column select signal Y1 and the activation of the strobe signal IOSTRB. If a voltage difference between the local lines LIO and LIOB is small, the sense amplifier 140 may not detect the voltage difference properly. In order for a voltage difference between the local lines LIO and LIOB to be sufficiently great, a point of time at which the sense amplifier 140 detects the voltage difference may be selected to be at a later point in time. However, in such a case, the data output operating speed may be reduced.

Meanwhile, after data is outputted to the global I/O line GIO, the local lines LIO and LIOB may be precharged again. In order to reduce the time tPRE for precharging the local lines LIO and LIOB up to a target level, the precharge voltage VPERI supplied to the local lines LIO and LIOB is to be high. However, if the precharge voltage VPERI is high, power consumption is increased.

Furthermore, since all the page buffers PB1 to PBn are coupled to the local lines LIO and LIOB, the local lines LIO and LIOB are long and parasitic capacitance between the local lines LIO and LIOB is also increased. In addition, a voltage difference between the local lines LIO and LIOB may not be greatly increased by the time that the sense amplifier 140 is to detect the voltage difference. The time tPRE for precharging the local lines LIO and LIOB may also increase due to not only the parasitic capacitance as discussed before, but also due to others reasons in the manufacture process or operating conditions such as operating temperature.

In addressing above discussed features, if the local lines LIO and LIOB are reduced by half or more in lengths, a voltage difference between the local lines LIO and LIOB can more quickly increase and the precharge time for the local lines LIO and LIOB can also be reduced to further reduce the time at which the sense amplifier 140 is able to detect the voltage difference properly. Detailed operations thereof are described as follows.

Figure 3:
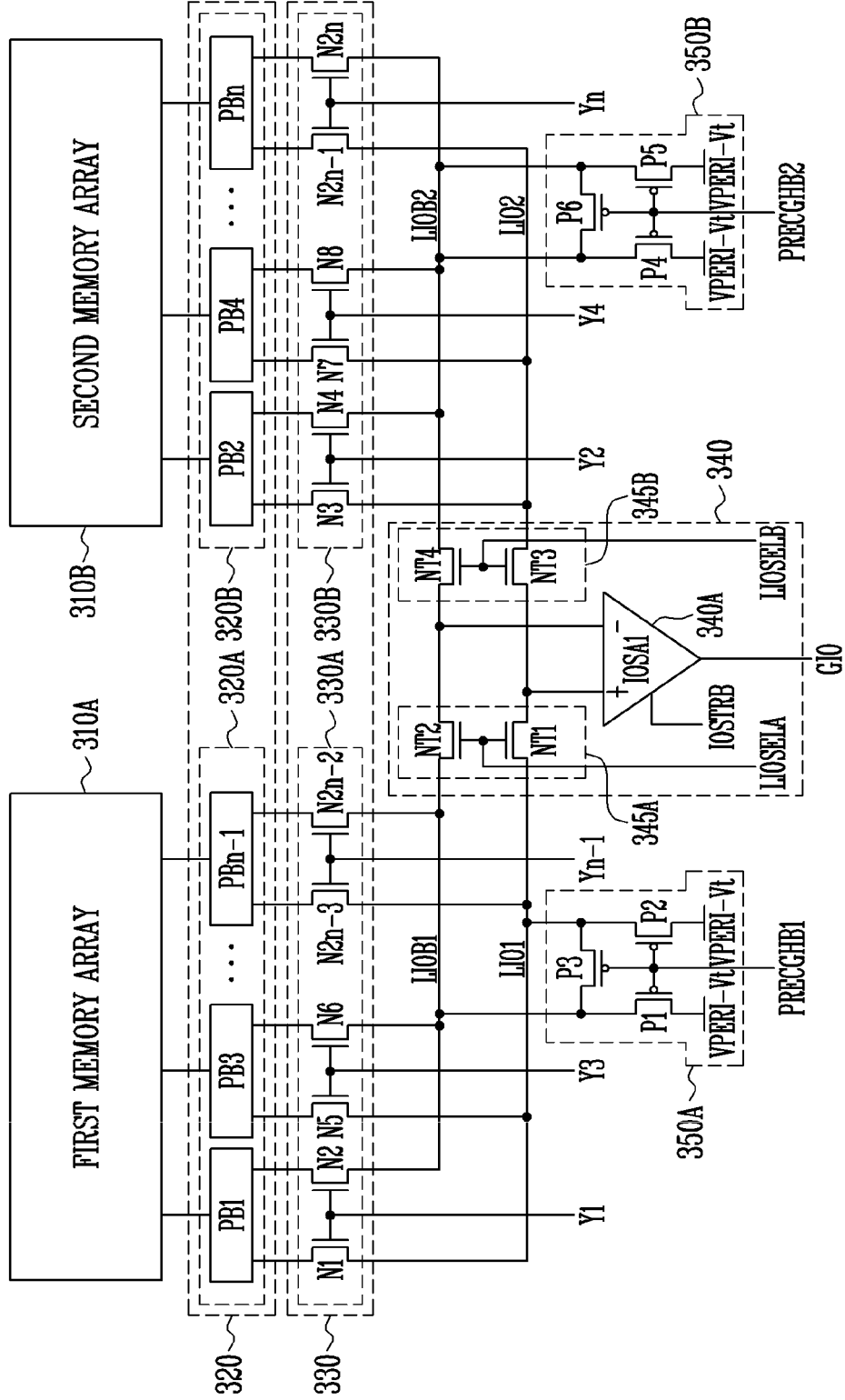
FIG. 3 is a circuit diagram of a semiconductor memory device according to another exemplary embodiment of this disclosure.

FIG. 3 is a circuit diagram of a semiconductor memory device according to another exemplary embodiment of this disclosure.

Referring to FIG. 3, the semiconductor memory device includes a first memory array 310A, a second memory array 310B, a page buffer group 320, a coupling circuit 330, a sense amplifier 340, and precharge circuits 350A and 350B.

The first and second memory arrays 310A and 310B according to an example may be a single physical memory array logically divided into the two memory arrays. For example, if one physical memory plane is divided into two logical subplanes, the two subplanes may operates as the first and second memory arrays 310A and 310B. Other memory configurations such as having two physical subplanes may also be used according to various design needs.

The page buffer group 320 according to an example has the same construction as the page buffer group shown in FIG. 1 except having first and second logical memory arrays 310A and 310B, which may be two logical memory arrays on opposite sides of a same memory array or two different physical memory arrays on opposing sides. Here, page buffers PB1 to PBn included in the page buffer group 320 are divided into a first page buffer group 320A and a second page buffer group 320B. The first page buffer group 320A is coupled to the memory cells of the first memory array 310A through bit lines, and the second page buffer group 320B is coupled to the memory cells of the second memory array 310B through bit lines.

The coupling circuit 330 may also be divided into a first coupling circuit 330A and a second coupling circuit 330B. The first coupling circuit 330A includes switching elements N1, N2, N5, N6 to N2n-3, and N2n-2 coupled to the page buffers PB1, PB3 to PBn-1 of the first page buffer group 320A. The second coupling circuit 330B includes switching elements N3, N4, N7, N8 to N2n-1, and N2n coupled to the page buffers PB2, PB4 to PBn of the second page buffer group 320B.

The first coupling circuit 330A sequentially couples the terminals (including the output terminals and the inverse output terminals) of the page buffers PB1 and PB3 to PBn-1, included in the first page buffer group 320A, to a first I/O bus including a first local I/O line LIO1 and a first inverse local I/O line LIOB1 in response to the even column select signals Y1 and Y3 to Yn-1 of the column select signals Y1 to Yn.

The second coupling circuit 330B sequentially couples the terminals (including the output terminals and the inverse output terminals) of the page buffers PB2 and PB4 to PBn, included in the second page buffer group 320B, to a second I/O bus including a second local I/O line LIO2 and a second inverse local I/O line LIOB2 in response to the odd column select signals Y2 and Y4 to Yn of the column select signals Y1 to Yn.

The sense amplifier 340 includes a sense amplifier 340A and sense line select circuits 345A and 345B. The sense amplifier 340A detects and amplifies a voltage difference between a first input terminal and a second input terminal in response to a strobe signal IOSTRB and outputs an amplified signal to a global I/O line GIO.

The sense line select circuits 345A and 345B couple the first local I/O line LIO1 and the first inverse local I/O line LIOB1 to the first and second input terminals of the sense amplifier 340A, respectively, or couple a second local I/O line LIO2 and a second inverse local I/O line LIOB2 to the first and second input terminals of the sense amplifier 340A, respectively, in response to first and second sense line select signals LIOSELA and LIOSELB, respectively.

In particular, the first sense line select circuit 345A couples the first local lines LIO1 and LIOB1 to the first and second input terminals of the sense amplifier 340A, respectively, in response to the first sense line select signal LIOSELA. Furthermore, the second sense line select circuit 345B couples the second local lines LIO2 and LIOB2 to the first and second input terminals of the sense amplifier 340A in response to the second sense line select signal LIOSELB.

Accordingly, the sense amplifier 340A detects and amplifies a voltage difference between one of the first local lines LIO1 and LIOB1 and one of the second local lines LIO2 and LIOB2 and outputs detected data to the global I/O line GIO. Furthermore, the sense amplifier 340 alternately detects and amplifies a voltage difference between a selected one of the first local lines LIO1 and LIOB1 and a selected one of the second local lines LIO2 and LIOB2 in response to the first and second line select signals LIOSELA and LIOSELB.

Since the local lines are divided into the first local lines LIO1 and LIOB1 and the second local lines LIO2 and LIOB2, the first precharge circuit 350A for precharging the first local lines LIO1 and LIOB1 in response to a first precharge signal PRECGHB1 and the second precharge circuit 350B for precharging the second local lines LIO2 and LIOB2 in response to a second precharge signal PRECGHB2 are used.

Since the memory array is divided into the two memory arrays 310A and 310B, the local lines are divided into the first local lines LIO1 and LIOB1 and the second local lines LIO2 and LIOB2, and the first and second local lines LIO1, LIOB1, LIO2, and LIOB2 are reduced to half in length. Accordingly, parasitic capacitance between the first local lines LIO1 and LIOB1 or the second local lines LIO2 and LIOB2 is reduced and the local lines are more quickly be precharged and a voltage difference between the local lines more quickly increase.

Furthermore, since the length of the local lines is reduced, a precharge voltage VPERI-Vt for precharging the local lines may be lower than the precharge voltage VPERI used for the FIG. 1 circuit, leading to reduced power consumption. In addition, since a voltage difference between the local lines more quickly increases, the time before the sense amplifier 340A is able to properly detect a voltage difference may be reduced, thereby increasing the operating speed.

Here, if the switching elements P1 to P6 of the precharge circuits 350A and 350B or the switching elements N1 to N2n of the coupling circuit 330 are implemented using low-threshold voltage transistors having threshold voltages (for example, 0.5 V) lower than the threshold voltages (for example, 0.7 V) of common transistors, the time that it takes to precharge the local lines may be further reduced and power consumption thereof may be further reduced.

According to an example, the sense amplifier 340 may be placed in the middle of the first and second page buffer groups 320A and 320B so that the length of the first local lines LIO1 and LIOB1 is equal to the length of the second local lines LIO2 and LIOB2.

The operation of the semiconductor memory device is as follows.

Figure 4:
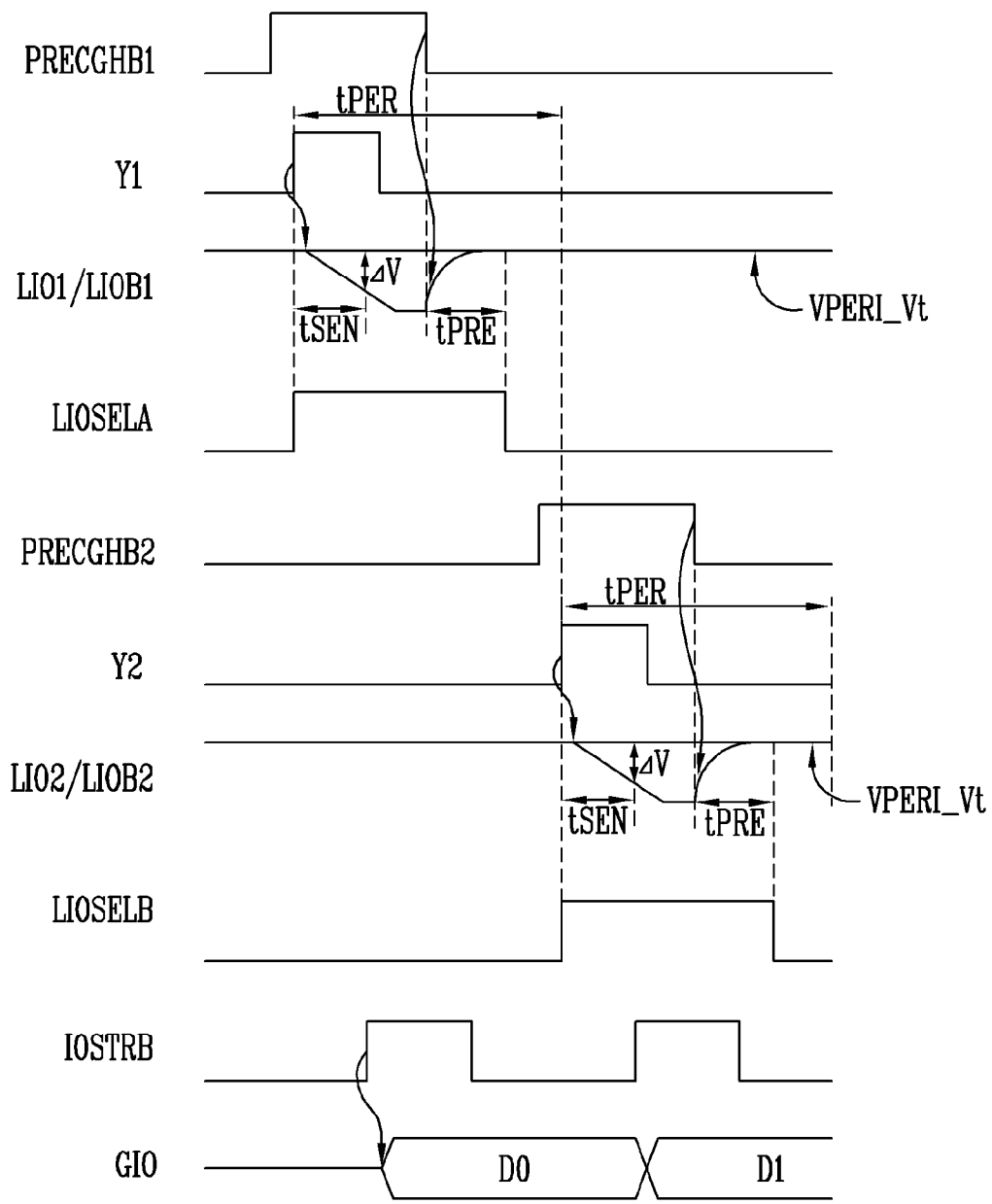
FIG. 4 is a waveform illustrating the operation of the semiconductor memory device shown in FIG. 3.

FIG. 4 is a waveform illustrating the operation of the semiconductor memory device shown in FIG. 3.

Referring to FIGS. 3 and 4, the first local lines LIO1 and LIOB1 are precharged. More specifically, when the first precharge signal PRECGHB1 of a low level is received, the first local lines LIO1 and LIOB1 are precharged with the precharge voltage VPERI-Vt supplied from the first precharge circuit 350A. Next, when the first precharge signal PRECGHB1 shifts to a high level, the first precharge circuit 350A is disabled and the supply of the precharge voltage VPERI-Vt is stopped. At this time, the first local lines LIO1 and LIOB1 enters a floating state. Here, even though the supply of the precharge voltage VPERI is stopped, the first local lines LIO1 and LIOB1 remain precharged.

The first page buffer group 320A performs an operation of selecting a page buffer. When the column select signal Y1 is activated, the output terminal and the inverse output terminal of the page buffer PB1 are coupled to the first local lines LIO1 and LIOB1 of the first coupling circuit 330A and data and the inverse data are outputted from the page buffer PB1 to the first local lines LIO1 and LIOB1, respectively. A voltage of one of the first local lines LIO1 and LIOB1 is lowered by data or inverse data of the page buffer PB1. Furthermore, in response to the first line select signal LIOSELA, the first sense line select circuit 345A couples the first local lines LIO1 and LIOB1 to the first and second input terminals of the sense amplifier 340A.

Next, a data output operation is performed. When the strobe signal IOSTRB of a high level is received, the sense amplifier 340A detects and amplifies a voltage difference between the first local lines LIO1 and LIOB1 and outputs data D0, corresponding to a result of the amplification, to the global I/O line GIO. Meanwhile, the sense amplifier 340A outputs the data D0 based on the voltage difference between the first local lines LIO1 and LIOB1 when the strobe signal IOSTRB is at a rising edge.

After the data D0 is outputted to the global I/O line GIO, data D1 stored in the page buffer PB2 of the second page buffer group 320B is outputted to the global I/O line GIO by means of an operation of precharging the second local lines LIO2 and LIOB2, an operation of the second page buffer group 320B selecting the page buffer PB2 in response to the odd column select signal Y2, and an operation of outputting the data D1.

As the above-described operation is repeated, a voltage difference between the first local lines LIO1 and LIOB1 and a voltage difference between the second local lines LIO2 and LIOB2 are alternately detected and amplified, and thus data stored in the first memory array 310A and data stored in the second memory array 310B are alternately outputted to the global I/O line GIO.

When a voltage difference between the first local lines LIO1 and LIOB1 is to be detected and amplified, the second local lines LIO2 and LIOB2 are precharged. When a voltage difference between the second local lines LIO2 and LIOB2 is to be detected and amplified, the first local lines LIO1 and LIOB1 are precharged. Accordingly, power consumption thereof can be further reduced, while the local lines more quickly precharge and a low precharge voltage is used.

Furthermore, parasitic capacitance between the local lines is reduced because the local lines are reduced to half in length. For this reason, when the output terminal and the inverse output terminal of the page buffer are coupled to the local lines, a voltage difference between the local lines more quickly increases. Consequently, the time tSEN for the sense amplifier 340A to detect the voltage difference after the column select signal is activated is reduced, thereby improving the operating speed of the device.

Figure 5:
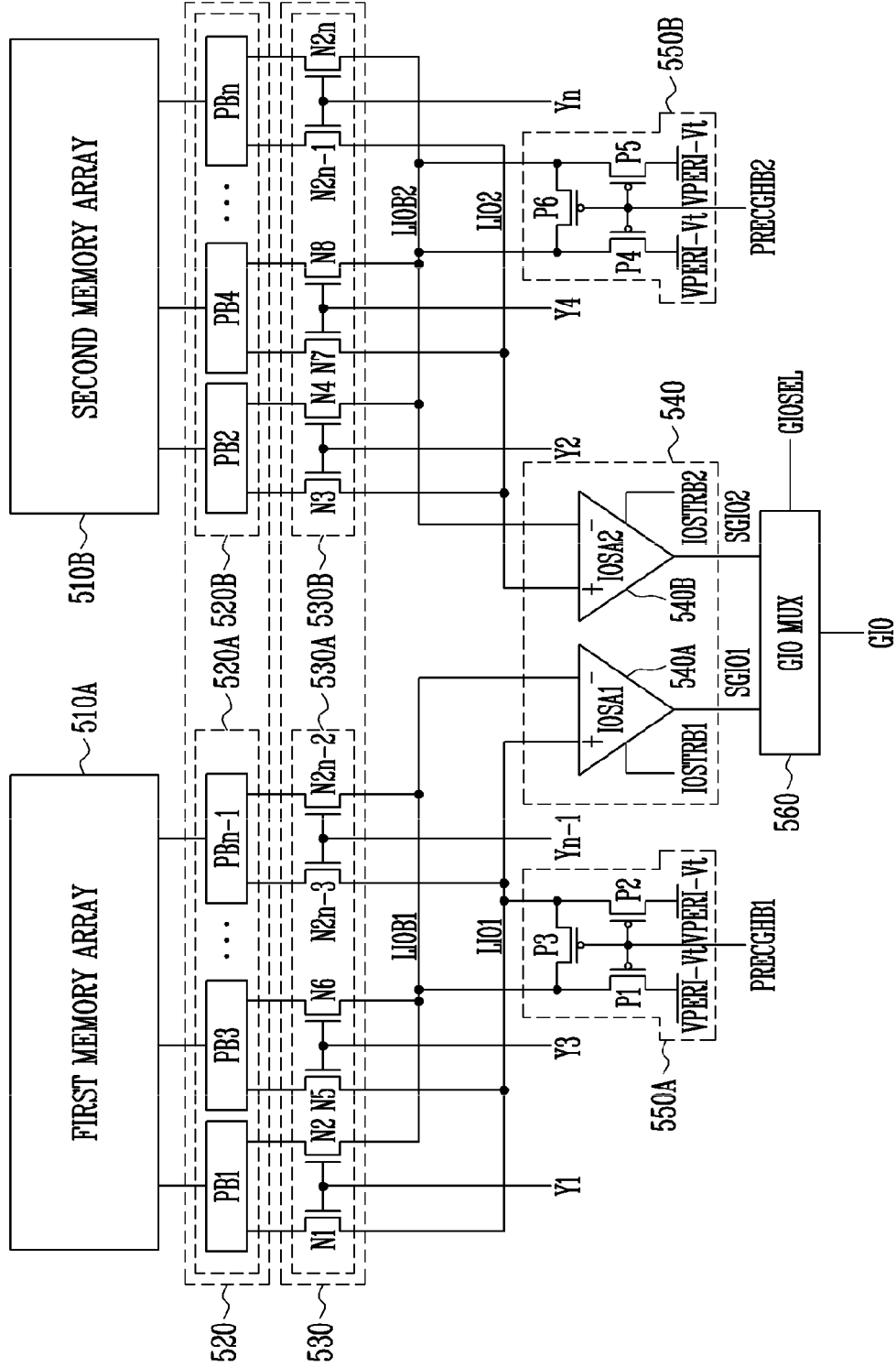
FIG. 5 is a circuit diagram of a semiconductor memory device according to yet another exemplary embodiment of this disclosure.

FIG. 5 is a circuit diagram of a semiconductor memory device according to yet another exemplary embodiment of this disclosure.

The memory arrays 510A and 510B, the page buffer group 520, the coupling circuit 530, the precharge circuits 350A and 350B, and the local lines LIO1, LIOB1, LIO2, and LIOB2 of the semiconductor memory device shown in FIG. 5 have the same structures as the memory arrays 310A and 310B, the page buffer group 320, the coupling circuit 330, the precharge circuits 350A and 350B, and the local lines LIO1, LIOB1, LIO2, and LIOB2 of the semiconductor memory device shown in FIG. 3 except for having two sense amplifiers 540A and 540B and a multiplexer 560. Here, the page buffer groups are on opposing sides with respect to sense amplifier(s).

In this structure, the first local lines LIO1 and LIOB1 are directly coupled to the first and second input terminals of the first sense amplifier 540A, and the second local lines LIO2 and LIOB2 are directly coupled to the first and second input terminals of the second sense amplifier 540B. Accordingly, the sense line select circuits 345A and 345B of FIG. 3 are omitted from FIG. 5.

The first local lines LIO1 and LIOB1 are coupled to the first and second input terminals of the first sense amplifier 540A. The first sense amplifier 540A detects and amplifies a voltage difference between the first local lines LIO1 and LIOB1 in response to a first strobe signal IOSTRB1 and outputs data of a page buffer, corresponding to a result of the amplification, to a first subglobal I/O line SGIO1. The second local lines LIO2 and LIOB2 are coupled to the first and second input terminal of the second sense amplifier 540B. The second sense amplifier 540B detects and amplifies a voltage difference between the second local lines LIO2 and LIOB2 in response to a second strobe signal IOSTRB2 and outputs data of a page buffer, corresponding to a result of the amplification, to a second subglobal I/O line SGIO2.

The multiplexer 560 selects the first subglobal I/O line SGIO1 or the second subglobal I/O line SGIO2 in response to an output select signal GIOSEL and outputs the data of the first sense amplifier 540A or the second sense amplifier 540B to the global I/O line GIO.

The operation of the semiconductor memory device is described in detail below.

Figure 6:
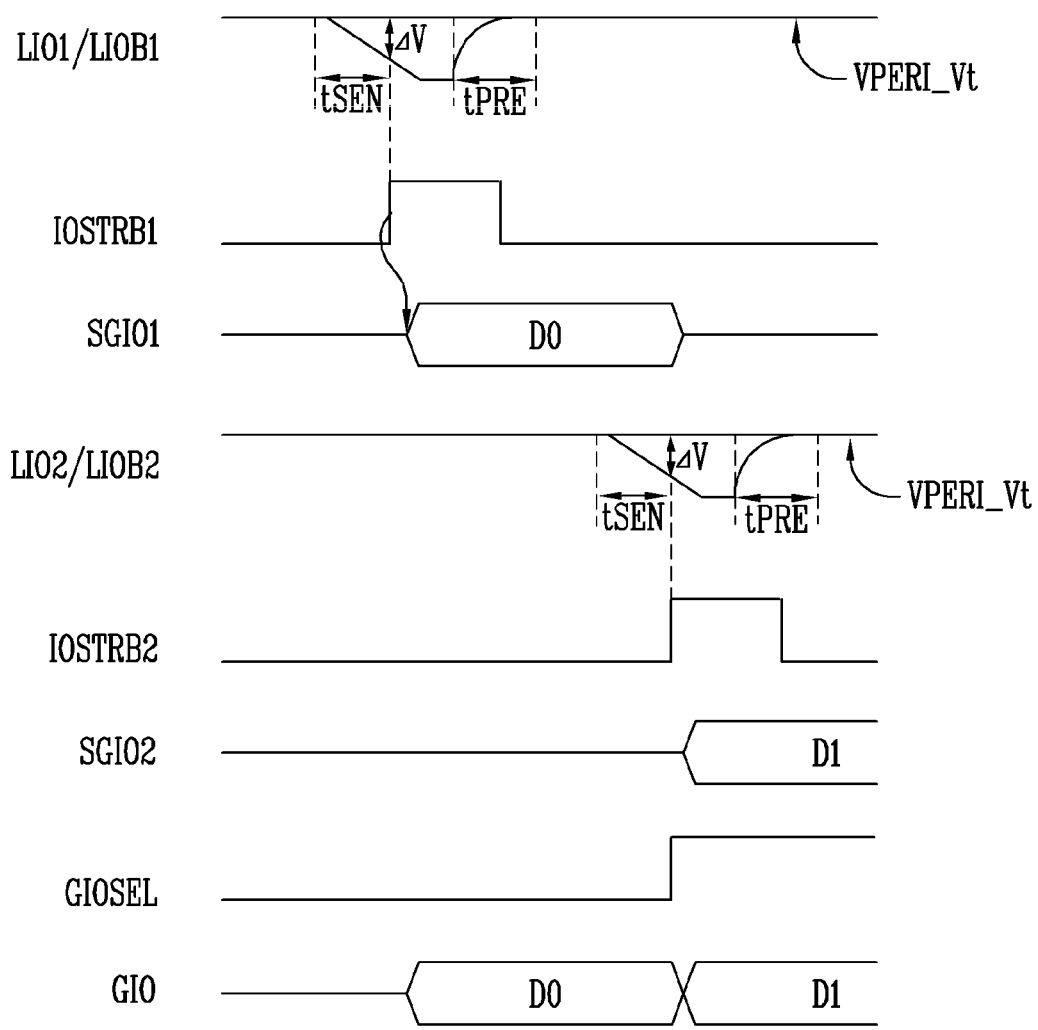
FIG. 6 is a waveform illustrating the operation of the semiconductor memory device shown in FIG. 5.

FIG. 6 is a waveform illustrating the operation of the semiconductor memory device shown in FIG. 5.

Referring to FIGS. 5 and 6, the first local lines LIO1 and LIOB1 are precharged. More specifically, when the first precharge signal PRECGHB1 of a low level is received, the first local lines LIO1 and LIOB1 are precharged with the respective precharge voltages VPERI-Vt supplied from the first precharge circuit 550A. Next, when the first precharge signal PRECGHB1 shifts to a high level, the first precharge circuit 550A is disabled and the supply of the precharge voltages VPERI-Vt is stopped. At this time, the first local lines LIO1 and LIOB1 enter a floating state, and the first local lines LIO1 and LIOB1 remain precharged although the supply of the precharge voltage VPERI is stopped.

An operation of the first page buffer group 520A selecting a page buffer is performed. When the column select signal Y1 is activated, the output terminal and the inverse output terminal of the page buffer PB1 are coupled to the first local lines LIO1 and LIOB1 by means of the first coupling circuit 530A and the data and the inverse data of the page buffer PB1 are outputted to the first local lines LIO1 and LIOB1. A voltage of one of the first local lines LIO1 and LIOB1 is lowered by the data or the inverse data of the page buffer PB1.

Next, a data output operation is performed. When the first strobe signal IOSTRB1 of a high level is received, the first sense amplifier 540A detects and amplifies a voltage difference between the first local lines LIO1 and LIOB1 and outputs data D0, corresponding to a result of the amplification, to the first subglobal I/O line SGIO1. Meanwhile, the first sense amplifier 540A outputs the data D0 based on the voltage difference between the first local lines LIO1 and LIOB1 when the first strobe signal IOSTRB1 is at a rising edge.

In response to the output select signal GIOSEL of a low level, the multiplexer 560 selects the first subglobal I/O line SGIO1 and outputs the data D0 of the first sense amplifier 540A to the global I/O line GIO.

After the data D0 is outputted to the global I/O line GIO, data D1 stored in the page buffer PB2 of the second page buffer group 320B is outputted to the global I/O line GIO by means of an operation of precharging the second local lines LIO2 and LIOB2, an operation of the second page buffer group 320B selecting the page buffer PB2 in response to an odd column select signal Y2, and a data output operation.

As the above-described operation is repeated, a voltage difference between the first local lines LIO1 and LIOB1 and a voltage difference between the second local lines LIO2 and LIOB2 are alternately detected and amplified by the first sense amplifier 540A and the second sense amplifier 540B, and thus the data of the first memory array 510A and the data of the second memory array 510B are alternately outputted to the global I/O line GIO.

Although the two sense amplifiers 540A and 540B are used in FIG. 5, an increase in the entire area for the FIG. 5 circuit can be minimized because the sense line select circuits 345A and 345B of FIG. 3 are omitted. Furthermore, since the sense line select circuits 345A and 345B are omitted, a resistance component between the coupling circuit 530 and the input terminals of the sense amplifiers 540A and 540B can be reduced. Accordingly, there is an advantage in that the operating speed may be decreased and power consumption thereof may be further reduced.

According to the present disclosure, since the time for outputting data from the output terminal and the inverse output terminal of the page buffer to the global word line is reduced, the operating speed may be improved.

What is claimed is:

1. A semiconductor memory device, comprising:
a first page buffer group including a plurality of page buffers coupled to memory cells of a first memory array through bit lines;
a second page buffer group including a plurality of page buffers coupled to memory cells of a second memory array through bit lines; and
a coupling circuit configured to couple a first terminal of a selected page buffer of the first page buffer group to a first I/O bus or a second terminal of a selected page buffer of the second page buffer group to a second I/O bus, in response to a column select signal,
wherein the first I/O bus comprises a first local I/O line and a first local inverse I/O line, the second I/O bus comprises a second local I/O line and a second local inverse I/O line.

2. The semiconductor memory device of claim 1, wherein the coupling circuit is configured to couple the first local I/O line and the first inverse local line to the first terminal including an output terminal and an inverse output terminal of the selected page buffer of the first page buffer group, and to couple the second local I/O line and the second inverse local line to the second terminal including an output terminal and an inverse output terminal of the selected page buffer of the second page buffer group.

3. The semiconductor memory device of claim 1, further comprising a sense amplifier configured to detect a voltage difference between the first local I/O line and the first inverse local I/O line or a voltage difference between the second local I/O line and the second inverse local I/O line in response to line select signals and to output data of the selected page buffer of the first page buffer group or the selected page buffer of the second page buffer group to a global I/O line.

4. The semiconductor memory device of claim 3, wherein the sense amplifier comprises:
a sense amplifier unit configured to detect a voltage difference between a first input terminal and a second input terminal in response to a strobe signal and output an amplified signal to the global I/O line; and
a sense line select circuit configured to couple the first local I/O line and the first inverse local I/O line or the second local I/O line and the second inverse local I/O line to the first and second input terminals of the sense amplifier, respectively in response to respective line select signals.

5. The semiconductor memory device of claim 4, wherein the sense line select circuit comprises:
a first sense line select circuit configured to couple the first local I/O line and the first inverse local I/O line to the first and second input terminals of the sense amplifier, respectively, in response to one of the line select signals; and
a second sense line select circuit configured to couple the second local I/O line and the second inverse local I/O line to the first and second input terminals of the sense amplifier, respectively, in response to another of the line select signals.

6. The semiconductor memory device of claim 4, wherein the sense line select circuit is configured to alternately couples a pair of the first local I/O line and the first inverse local I/O line and a pair of the second local I/O line and the second inverse local I/O line to the first and second input terminals of the sense amplifier, respectively.

7. The semiconductor memory device of claim 3, wherein the sense amplifier is disposed at a middle point between the first and second page buffer groups such that a length of the first local I/O line is equal to a length of the second local I/O line and a length of the second inverse local I/O line is equal to a length of the second inverse local I/O line.

8. A semiconductor memory device, comprising:
a first page buffer group including a plurality of page buffers coupled to memory cells of a first memory array through bit lines;
a second page buffer group including a plurality of page buffers coupled to memory cells of a second memory array through bit lines;
a coupling circuit configured to couple an output terminal and an inverse output terminal of a selected page buffer of the first page buffer group to a first local I/O line and a first inverse local I/O line, respectively, or an output terminal and an inverse output terminal of a selected page buffer from the second page buffer group, to a second local I/O line and a second inverse local I/O line, respectively, in response to a column select signal;
a first sense amplifier configured to detect a voltage difference between the first local I/O line and the first inverse local I/O line in response to a first strobe signal;
a second sense amplifier configured to detect a voltage difference between the second local I/O line and the second inverse local I/O line in response to a second strobe signal; and a multiplexer configured to output an output signal of the first sense amplifier or the second sense amplifier to a global I/O line in response to an output select signal.

9. The semiconductor memory device of claim 8, wherein the coupling circuit is configured to alternately couple the page buffers of the first page buffer group to the first local I/O line and the first inverse local I/O line and alternately couple the page buffers of the second page buffer group to the second local I/O line and the second inverse local I/O line, in response to a plurality of the column select signals.

10. The semiconductor memory device of claim 9, wherein the coupling circuit is configured to couple the page buffers of the first page buffer group to the first local I/O line and the first inverse local I/O line in response to even column select signals of the column select signals and couple the page buffers of the second page buffer group to the second local I/O line and the second inverse local I/O line in response to odd column select signals of the column select signals.

11. The semiconductor memory device of claim 1, wherein the coupling circuit comprises:
   a first coupling circuit configured to couple an output terminal and an inverse output terminal of the selected page buffer of the first page buffer group to the first local I/O line and the first inverse local I/O line, respectively, in response to an even column select signal of the column select signals; and
   a second coupling circuit configured to couple an output terminal and an inverse output terminal of the selected page buffer of the second page buffer group to the second local I/O line and the second inverse local I/O line, respectively, in response to an odd column select signal of the column select signals.

12. The semiconductor memory device of claim 1, further comprising:
   a first precharge circuit configured to precharge the first local I/O line and the first inverse local I/O line in response to a first precharge signal; and
   a second precharge circuit configured to precharge the second local I/O line and the second inverse local I/O line in response to a second precharge signal.

13. The semiconductor memory device of claim 12, wherein: the first precharge circuit is configured to precharge the first local I/O line and the first inverse local I/O line when the voltage difference between the second local I/O line and the second inverse local I/O line is detected, and the second precharge circuit is configured to precharge the second local I/O line and the second inverse local I/O line when the voltage difference between the first local I/O line and the first inverse local I/O line is detected.

14. The semiconductor memory device of claim 8, wherein the first and second sense amplifiers are configured to alternately detect the voltage difference between a pair of the first local I/O line and the first inverse local I/O line and the voltage difference between a pair of the second local I/O line and the second inverse local I/O line in response to the first and second strobe signals, respectively.

15. The semiconductor memory device of claim 8, wherein the first and second sense amplifiers are disposed at a middle point between the first and second page buffer groups such that a length of the first local I/O line is equal to a length of the second local I/O line and a length of the second inverse local I/O line is equal to a length of the second inverse local I/O line.

16. The semiconductor memory device of claim 8, wherein the coupling circuit comprises:
   a first coupling circuit configured to couple an output terminal and an inverse output terminal of the selected page buffer of the first page buffer group to the first local I/O line and the first inverse local I/O line, respectively, in response to an even column select signal of the column select signals; and
   a second coupling circuit configured to couple an output terminal and an inverse output terminal of the selected page buffer of the second page buffer group to the second local I/O line and the second inverse local I/O line, respectively, in response to an odd column select signal of the column select signals.

17. The semiconductor memory device of claim 8, further comprising:
   a first precharge circuit configured to precharge the first local I/O line and the first inverse local I/O line in response to a first precharge signal; and
   a second precharge circuit configured to precharge the second local I/O line and the second inverse local I/O line in response to a second precharge signal.

18. The semiconductor memory device of claim 17, wherein: the first precharge circuit is configured to precharge the first local I/O line and the first inverse local I/O line when the voltage difference between the second local I/O line and the second inverse local I/O line is to be detected, and the second precharge circuit is configured to precharge the second local I/O line and the second inverse local I/O line when the voltage difference between the first local I/O line and the first inverse local I/O line is to be detected.

19. The semiconductor memory device of claim 3, wherein the first and second page buffer groups are disposed on opposite sides of the sense amplifier.

20. The semiconductor memory device of claim 8, wherein the first and second page buffer groups are disposed on opposite sides with respect to the sense amplifiers as a group.

* * * * *